(12) United States Patent
Alsaqqa et al.

(10) Patent No.: US 11,703,771 B2
(45) Date of Patent: Jul. 18, 2023

(54) VARIABLE DIFFRACTION GRATING

(71) Applicants: ASML Holding N.V., Eindhoven (NL); ASML Netherlands B.V., Eindhoven (NL)

(72) Inventors: Ali Alsaqqa, Trumbull, CT (US); Fadi El-Ghussein, Holmdel, NJ (US); Lambertus Gerardus Maria Kessels, Clifton Park, NY (US); Roxana Rezvani Naraghi, Easton, CT (US); Krishanu Shome, Cheshire, CT (US); Timothy Allan Brunner, Ridgefield, CT (US); Sergei Sokolov, Eindhoven (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/773,003

(22) PCT Filed: Oct. 12, 2020

(86) PCT No.: PCT/EP2020/078615
§ 371 (c)(1),
(2) Date: Apr. 28, 2022

(87) PCT Pub. No.: WO2021/083649
PCT Pub. Date: May 6, 2021

(65) Prior Publication Data
US 2022/0390861 A1    Dec. 8, 2022

Related U.S. Application Data

(60) Provisional application No. 62/927,206, filed on Oct. 29, 2019.

(51) Int. Cl.
G03F 7/20 (2006.01)
G03F 9/00 (2006.01)

(52) U.S. Cl.
CPC .......... G03F 9/7019 (2013.01); G03F 9/7076 (2013.01)

(58) Field of Classification Search
CPC .... G03F 9/7019; G03F 9/7076; G03F 9/7092; G03F 7/70616; G03F 7/70516; G03F 7/70683; G03F 9/7084; G03F 9/708
See application file for complete search history.

(56) References Cited

U.S. PATENT DOCUMENTS

| 6,091,481 A | 7/2000 | Mori |
| 7,112,813 B2 | 9/2006 | Den Boef et al. |
| 2002/0026878 A1 | 3/2002 | Kwan et al. |

(Continued)

FOREIGN PATENT DOCUMENTS

| EP | 1 186 959 A2 | 3/2002 |
| JP | H09-017713 A | 1/1997 |

(Continued)

OTHER PUBLICATIONS

International Search Report and Written Opinion of the International Searching Authority directed to related International Patent Application No. PCT/EP2020/078615, mailed Feb. 11, 2021; 11 pages.

(Continued)

*Primary Examiner* — Mesfin T Asfaw
(74) *Attorney, Agent, or Firm* — Sterne, Kessler, Goldstein & Fox P.L.L.C.

(57) ABSTRACT

A calibration system includes a plate, a fixed alignment mark, and a variable diffraction grating. The plate is adjacent to a wafer alignment mark disposed on a wafer. The fixed alignment mark is disposed on the plate and is configured to act as a reference mark for an initial calibration of the (Continued)

calibration system. The variable diffraction grating is disposed on the plate and includes a plurality of unit cells configured to form a plurality of variable alignment marks. The variable diffraction grating is configured to calibrate a shift-between-orders of one of the variable alignment marks and the fixed alignment mark.

17 Claims, 6 Drawing Sheets

(56) References Cited

U.S. PATENT DOCUMENTS

| | | |
|---|---|---|
| 2004/0129900 A1 | 7/2004 | Den Boef et al. |
| 2005/0190354 A1 | 9/2005 | De Jager |
| 2016/0077445 A1 | 3/2016 | Den Boef et al. |
| 2018/0107124 A1 | 4/2018 | Tukker et al. |
| 2019/0196341 A1* | 6/2019 | Violette .............. G03F 7/70616 |
| 2019/0227443 A1 | 7/2019 | Catey et al. |

FOREIGN PATENT DOCUMENTS

| | | |
|---|---|---|
| JP | H10-041219 A | 2/1998 |
| JP | H10-070068 A | 3/1998 |

OTHER PUBLICATIONS

International Preliminary Report on Patentability directed to related International Patent Application No. PCT/EP2020/078615, issued May 3, 2022; 7 pages.

Shih et al., "High-Resolution Electrostatic Analog Tunable Grating With a SingleMask Fabrication Process," Journal of Microelectromechanical Systems, vol. 15, No. 4, Aug. 2006; pp. 763-769.

European Office Action directed to European Patent Application No. 20792590.0, dated May 22, 2023; 8 pages.

Japanese Search Report directed to Japanese Patent Application No. 2023008477, dated May 12, 2023; 26 pages.

* cited by examiner

VARIABLE DIFFRACTION GRATING

CROSS-REFERENCE TO RELATED APPLICATION

The application claims priority of U.S. provisional patent application 62/927,206, which was filed on Oct. 29, 2019 and which is incorporated herein in its entirety by reference.

BACKGROUND

Field

The present disclosure relates to calibration apparatuses and systems for lithographic apparatuses and systems, for example.

Background

A lithographic apparatus is a machine constructed to apply a desired pattern onto a substrate. A lithographic apparatus can be used, for example, in the manufacture of integrated circuits (ICs). A lithographic apparatus may, for example, project a pattern of a patterning device (e.g., a mask, a reticle) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

In order to control the lithographic process to place device features accurately on the substrate, one or more diffraction targets (e.g., alignment marks) are generally provided on, for example, the substrate, and the lithographic apparatus includes one or more alignment marks, for example, on a fiducial plate, and alignment sensors by which the position of the diffraction target can be measured accurately. Existing calibration systems and techniques are subject to certain drawbacks and limitations. For example, space on a fiducial plate is limited and only a limited number of marks are available. If a specific pitch of interest is not available on the fiducial plate, an interpolation between the two closest available pitches is necessary. This can lead to errors or mismatches in alignment and calibration, for example, up to 2 nm, for shift-between-orders (SBO) calibration.

A dynamic or variable system can provide improved accuracy, calibration, and versatility since hundreds of different types of alignment marks can be implemented on the same common platform. The variable system can include individually controllable actuators (e.g., unit cells) to form a variety of different types of alignment marks for calibration.

SUMMARY

Accordingly, there is a need to expand the capabilities of current calibration systems and provide improved accuracy, precision, calibration, and versatility with a dynamic or variable system.

In some embodiments, a calibration system includes a plate, a fixed alignment mark, and a variable diffraction grating. The plate is adjacent to a wafer alignment mark disposed on a substrate. The fixed alignment mark is disposed on the plate. The fixed alignment mark is configured to act as a reference mark for an initial calibration of the calibration system. The variable diffraction grating is disposed on the plate. The variable diffraction grating includes a plurality of unit cells configured to form a plurality of variable alignment marks. The variable diffraction grating is configured to calibrate a shift-between-orders of one of the variable alignment marks and the fixed alignment mark.

In some embodiments, the shift-between-orders is a difference in measured position between one of the variable alignment marks and the fixed alignment mark. In some embodiments, each of the plurality of unit cells includes a microelectromechanical system (MEMS) actuator. In some embodiments, the MEMS actuator includes a piezoelectric material or a phase change material (PCM). In some embodiments, each of the plurality of unit cells includes a liquid crystal (LC) spatial light modulator (SLM).

In some embodiments, the fixed alignment mark includes a fixed alignment mark pitch, a fixed alignment mark duty cycle, a fixed alignment mark sub-segmentation, and a fixed alignment mark depth.

In some embodiments, the variable alignment mark includes a variable alignment mark pitch configured to be different than the fixed alignment mark pitch. In some embodiments, variable alignment mark includes a variable alignment mark duty cycle, a variable alignment mark sub-segmentation, and a variable alignment mark depth configured to be the same as the fixed alignment mark duty cycle, the fixed alignment mark sub-segmentation, and the fixed alignment mark depth. In some embodiments, the variable alignment mark pitch is about 0.2 µm to about 6.4 µm.

In some embodiments, the variable alignment mark includes a variable alignment mark duty cycle configured to be different than the fixed alignment mark duty cycle. In some embodiments, the variable alignment mark includes a variable alignment mark pitch, a variable alignment mark sub-segmentation, and a variable alignment mark depth configured to be the same as the fixed alignment mark pitch, the fixed alignment mark sub-segmentation, and the fixed alignment mark depth. In some embodiments, the variable alignment mark duty cycle is a fraction of the plurality of unit cells.

In some embodiments, the variable alignment mark includes a variable alignment mark sub-segmentation configured to be different than the fixed alignment mark sub-segmentation. In some embodiments, the variable alignment mark includes a variable alignment mark pitch, a variable alignment mark duty cycle, and a variable alignment mark depth configured to be the same as the fixed alignment mark pitch, the fixed alignment mark duty cycle, and the fixed alignment mark depth. In some embodiments, the variable alignment mark sub-segmentation includes a horizontal line, a vertical line, a diagonal line, a polygon, or some combination thereof. In some embodiments, the variable alignment mark sub-segmentation includes a variable sub-pitch.

In some embodiments, the variable alignment mark includes a variable alignment mark depth configured to be different than the fixed alignment mark depth. In some embodiments, the variable alignment mark includes a variable alignment mark pitch, a variable alignment mark duty cycle, and a variable alignment mark sub-segmentation configured to be the same as the fixed alignment mark pitch, the fixed alignment mark duty cycle, and the fixed alignment mark sub-segmentation. In some embodiments, the variable alignment mark depth is about 10 nm to about 150 nm.

In some embodiments, a lithographic apparatus includes an illumination system, a projection system, and a calibration system. The illumination system is configured to illuminate a patterning device. The projection system is configured to project an image of the patterning device onto a wafer. The calibration system is configured to match a wafer alignment mark on the wafer with one of a plurality of variable alignment marks on the calibration system in order to calibrate a shift-between-orders of one of the plurality of variable alignment marks and a fixed alignment mark. The calibration system includes a plate and a variable diffraction grating. The plate is adjacent to the wafer alignment mark and includes the fixed alignment mark. The variable diffraction grating is disposed on the plate and includes a plurality of unit cells configured to form the plurality of variable alignment marks.

In some embodiments, the wafer alignment mark includes a wafer alignment mark pitch and a wafer alignment mark depth and one of the variable alignment marks includes a variable alignment mark pitch configured to match the wafer alignment mark pitch and a variable alignment mark depth configured to match the wafer alignment mark depth. In some embodiments, the variable diffraction grating includes a variable alignment mark duty cycle configured to measure different diffraction orders of the wafer alignment mark. In some embodiments, the wafer alignment mark includes a wafer alignment mark sub-segmentation and one of the variable alignment marks includes a variable alignment mark sub-segmentation configured to match the wafer alignment mark sub-segmentation.

In some embodiments, a method of calibration for a lithographic apparatus includes measuring a fixed alignment mark position of a fixed alignment mark on a plate. The method of calibration further includes measuring a variable alignment mark position of one of a plurality of variable alignment marks on the plate. The plurality of variable alignment marks includes a plurality of variable actuators. The method of calibration further includes measuring a wafer alignment mark position of a wafer alignment mark on a wafer adjacent to the plate. The method of calibration further includes comparing the fixed alignment mark position and the variable alignment mark position of the plate to determine a shift-between-orders of one of the variable alignment marks and the fixed alignment mark. The method of calibration further includes calibrating the lithographic apparatus based on the shift-between-orders.

In some embodiments, the method of calibration further includes activating the plurality of variable actuators to form the plurality of variable alignment marks based on a characteristic of the wafer alignment mark. In some embodiments, the activating includes adjusting a pitch, a duty cycle, a sub-segmentation, a depth, or some combination thereof of the plurality of variable actuators. In some embodiments, the calibrating includes applying a shift-between-orders correction to the wafer alignment mark position.

Further features and exemplary aspects of the embodiments, as well as the structure and operation of various embodiments, are described in detail below with reference to the accompanying drawings. It is noted that the embodiments are not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the embodiments and, together with the description, further serve to explain the principles of the embodiments and to enable a person skilled in the relevant art(s) to make and use the embodiments.

Figure 1:
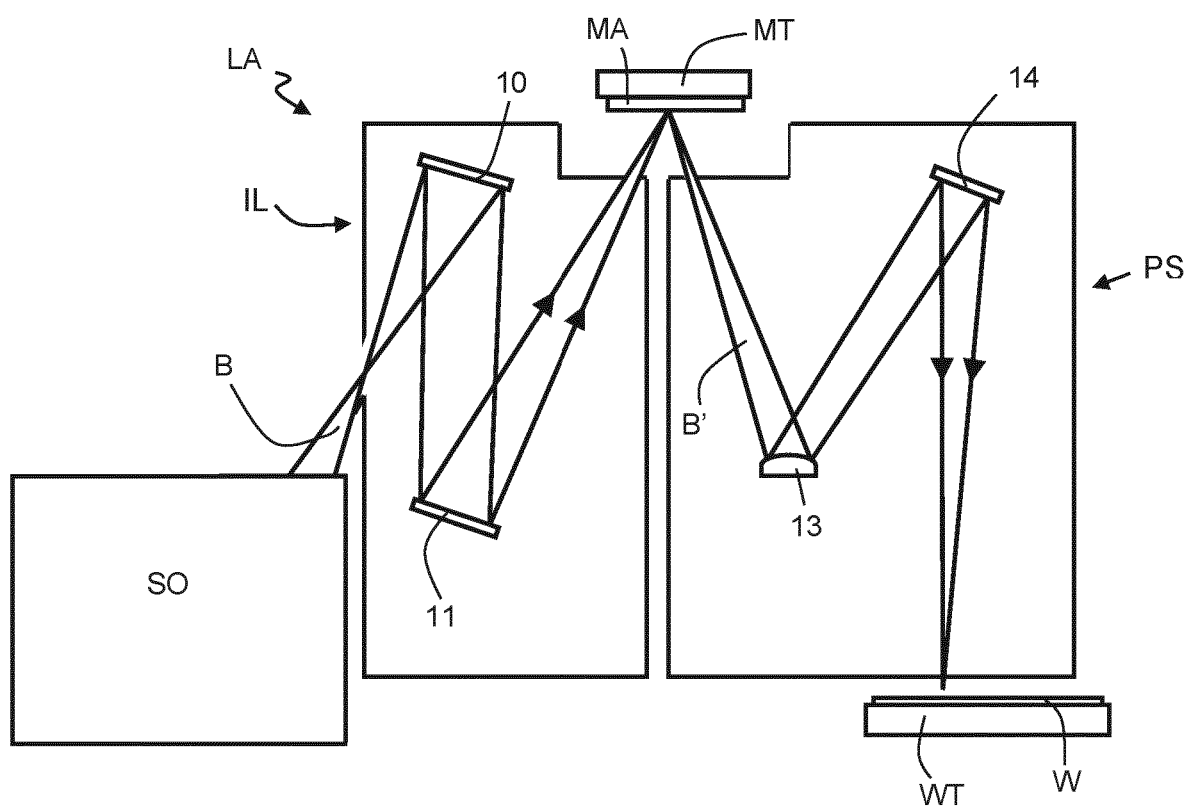
FIG. 1 is a schematic illustration of a lithographic apparatus, according to an exemplary embodiment.

The features and exemplary aspects of the embodiments will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this present invention. The disclosed embodiment(s) merely exemplify the present invention. The scope of the invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Exemplary Lithographic System

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS, and a substrate table WT configured to support a substrate W.

The illumination system IL is configured to condition the EUV radiation beam B before the EUV radiation beam B is incident upon the patterning device MA. Thereto, the illumination system IL may include a faceted field mirror device 10 and a faceted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated.

The projection system PS is configured to project the patterned EUV radiation beam B' onto the substrate W. For that purpose, the projection system PS may comprise a plurality of mirrors 13, 14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor of 4 or 8 may be applied. Although the projection system PS is illustrated as having only two mirrors 13, 14 in FIG. 1, the projection system PS may include a different number of mirrors (e.g. six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS.

The radiation source SO may be a laser produced plasma (LPP) source, a discharge produced plasma (DPP) source, a free electron laser (FEL), or any other radiation source that is capable of generating EUV radiation.

Exemplary Calibration System

As discussed above, in order to control the lithographic process to place device features accurately and precisely on the substrate (e.g., a wafer), one or more diffraction targets (e.g., alignment marks) are generally provided on, for example, the substrate, and the lithographic apparatus includes one or more alignment marks, for example, on a fiducial plate, and alignment sensors by which the position of the diffraction target can be measured accurately. Each alignment mark can be characterized by its (1) pitch, (2) duty cycle, (3) sub-segmentation, (4) sub-segmentation pitch, and/or (5) depth. Existing calibration systems and techniques are subject to certain drawbacks and limitations. For example, space on a fiducial plate is limited and only a limited number of specific pitches can be utilized (e.g., printed or fabricated directly on fiducial plate). Specifically, only a limited number of marks are available and those marks represent a small subset of pitches that a user may be interested in using. The end result being that if a specific pitch of interest is not available on the fiducial, an interpolation (e.g., estimation of a value within two known values, linear interpolation, etc.) between the two closest available pitches is necessary. This can lead to errors or mismatches in alignment and calibration, for example, up to 2 nm, for shift-between-orders (SBO) calibration.

SBO calibration can be utilized to correct alignment errors (e.g., such as those that are wavelength and/or order specific) between a fixed alignment mark and a variable alignment mark. SBO refers to a difference in measured position that arises when: (1) different diffraction orders are measured; (2) different wavelengths are measured for the same diffraction order; or (3) different wavelengths are measured for different diffraction orders. SBO calibration with diffraction gratings has been previously described in U.S. Pat. No. 7,112,813, issued Sep. 26, 2006, which is hereby incorporated by reference in its entirety.

A dynamic or variable system can provide improved accuracy, precision, calibration, and versatility since hundreds of different types of alignment marks can be implemented on a common platform (e.g., fiducial plate). The variable system can include individually controllable actuators (e.g., unit cells) that can form a variety of different types of alignment marks for calibration, including sub-cells. For example, each individually controllable actuator can be a microelectromechanical system (MEMS) actuator.

The variable system (e.g., a variable diffraction grating) can change a variety of parameters to achieve different alignment marks. For example, the variable system can change a pitch (e.g., to match a pitch of a wafer alignment mark on the wafer), a duty cycle (e.g., to measure different diffraction orders while maintaining the same pitch), a depth (e.g., to tune an intensity of light from the alignment mark to optimize detection and/or to match a wafer alignment mark intensity), and/or a sub-segmentation (e.g., to match different sub-marks within an alignment mark) of an alignment mark.

Each unit cell (e.g., sub-cell) can be as small as 20 nm by 20 nm (e.g., 400 nm$^2$) that can allow for customization of each alignment mark, for example, to better match a wafer alignment mark on the wafer and for calibration with a fixed alignment mark, for example, SBO calibration. Dynamic or variable calibration apparatuses and systems as discussed below can expand the capabilities of current calibration systems and provide improved accuracy, precision, calibration, and versatility, for example, in a lithographic apparatus.

Figure 2:
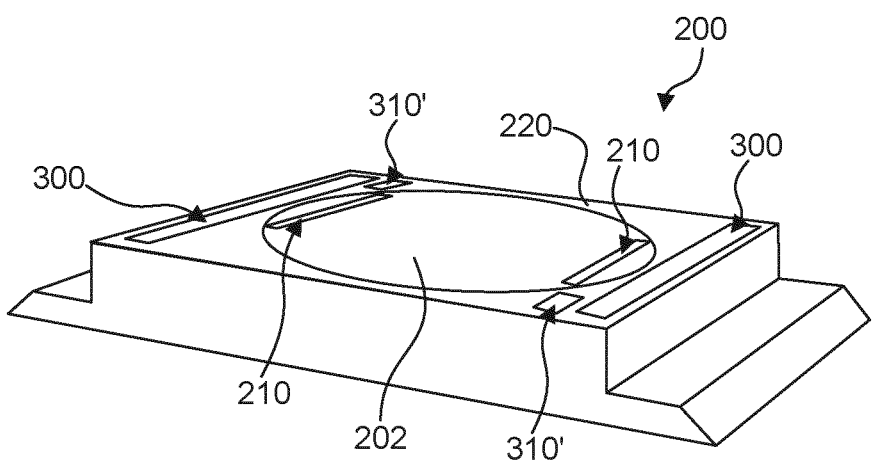
FIG. 2 is a top perspective schematic illustration of a calibration system, according to an exemplary embodiment.
Figure 3:
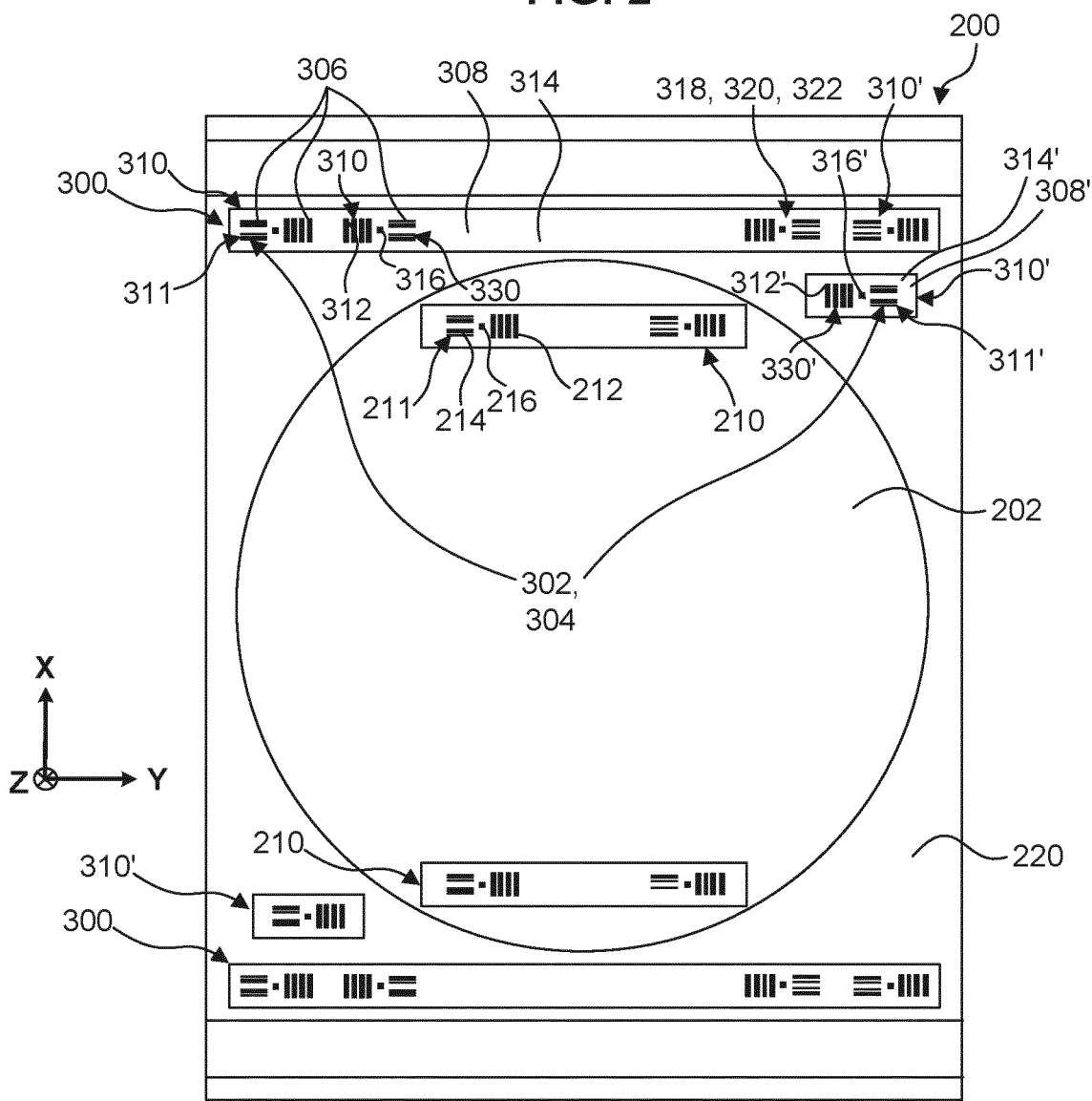
FIG. 3 is a top plan schematic illustration of the calibration system of FIG. 2, according to an exemplary embodiment.

FIGS. 2 and 3 illustrate calibration system 200, according to various exemplary embodiments. Calibration system 200 can be configured to measure a characteristic (e.g., alignment position, pitch, diffraction order, depth, sub-segmentation, etc.) of wafer alignment mark 210 on wafer 202 and improve alignment and calibration (e.g., SBO calibration), for example, in lithographic apparatus LA. Although calibration system 200 is shown in FIGS. 2 and 3 as a stand-alone apparatus, the embodiments of this disclosure are not limited to this example, and calibration system 200 embodiments of this disclosure can be used with other optical systems, such as, but not limited to, lithographic apparatus LA, substrate table WT, and/or other optical systems.

FIG. 2 illustrates a top perspective schematic of calibration system 200, according to an exemplary embodiment. Calibration system 200 can include wafer 202, wafer alignment mark 210, plate 220, variable diffraction grating 300, and/or fixed alignment mark 310'. FIG. 3 illustrates a top plan schematic of calibration system 200 as shown in FIG. 2, according to an exemplary embodiment.

As shown in FIG. 3, wafer alignment mark 210 can be disposed on wafer 202. Wafer 202 can be disposed adjacent to plate 220. In some embodiments, wafer 202 can be disposed on plate 220. In some embodiments, plate 220 can be disposed over wafer 202. Wafer alignment mark 210 can include wafer alignment mark pitch 212, wafer alignment mark sub-segmentation 214, and/or wafer alignment mark depth 216. In some embodiments, wafer alignment mark 210 can used in a calibration process, for example, SBO calibration. In some embodiments, wafer 202 can include a plurality of wafer alignment marks, for example, each similar to wafer alignment mark 210. In some embodiments, wafer 202 can be substrate W in lithographic apparatus LA. In some embodiments, plate 220 can be substrate table WT configured to support substrate W (e.g., wafer 202) in lithographic apparatus LA.

As shown in FIGS. 2 and 3, variable diffraction grating 300 can be disposed on plate 220. Variable diffraction grating 300 can include a plurality of unit cells 306 configured to form a plurality of variable alignment marks 310. Variable diffraction grating 300 can be configured to match wafer alignment mark 210, for example, by adjusting one of the plurality of variable alignment marks 310 (e.g., pitch, duty cycle, sub-segmentation, sub-segmentation pitch, and/or depth). Further, variable diffraction grating 300 can be configured to calibrate a shift-between-orders (SBO) of one of variable alignment marks 310 and fixed alignment mark 310'. As discussed above, SBO calibration can be used to correct alignment errors between fixed alignment mark 310' and variable alignment mark 310. In some embodiments, SBO 302 can be a difference in measured position 304 between one of variable alignment marks 310 and fixed alignment mark 310'. For example, a measured position (e.g., absolute position, relative position, pitch, diffraction order, etc.) of fixed alignment mark 310' can be compared to a measured position (e.g., absolute position, relative position, pitch, diffraction order, etc.) of variable alignment mark 310, and an error difference can be determined and calibrated, for example, by a processor (not shown) and/or alignment sensor (not shown) in calibration system 200 and/or lithographic apparatus LA.

In some embodiments, variable diffraction grating 300 can be a uniform shape. For example, as shown in FIG. 3, variable diffraction grating 300 can be a linear array with the plurality of unit cells 306. In some embodiments, variable diffraction grating 300 can be a non-uniform shape. For example, variable diffraction grating 300 can extend over a top surface area of plate 220 peripheral to wafer 202. In some embodiments, plate 220 can include one or more variable diffraction gratings 300. For example, as shown in FIGS. 2 and 3, plate 220 can include two variable diffraction gratings 300 disposed at opposite ends of plate 220. For example, plate 220 can include variable diffraction grating 300 and fixed alignment mark 310', for example, adjacent to variable diffraction grating 300. In some embodiments, wafer 202 can include one or more wafer alignment marks 210. For example, as shown in FIGS. 2 and 3, wafer 202 can include two wafer alignment marks 210 disposed at opposite ends of wafer 202. In some embodiments, as shown in FIG. 3, variable diffraction grating 300 can include fixed alignment mark 310'. For example, a portion of the plurality of unit cells 306 can be active cells 309 that are fixed (e.g., fixed pitch, fixed duty cycle, fixed sub-segmentation, fixed depth, etc.) to form fixed alignment mark 310'.

Figure 5:
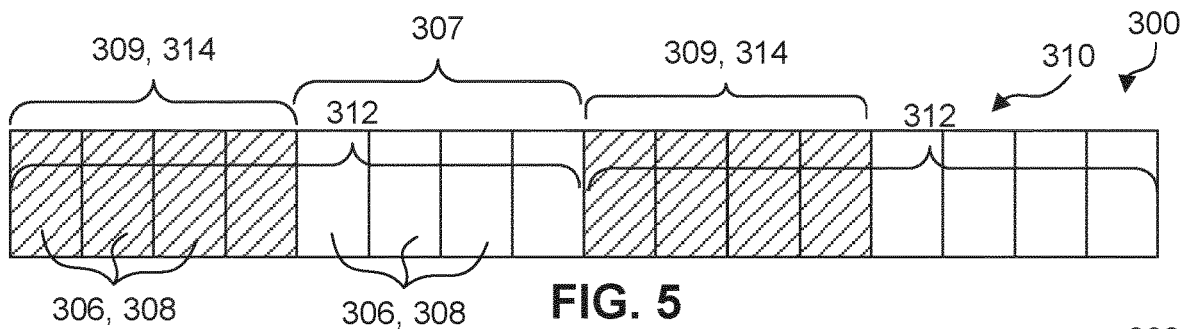
FIG. 5 is a top plan schematic of a variable diffraction grating, according to an exemplary embodiment.

Each of the plurality of unit cells 306 can include a microelectromechanical system (MEMS) actuator 308. In some embodiments, each of the plurality of unit cells 306 can include a plurality of sub-cells (not shown) that can each be a MEMS actuator, similar to MEMS actuator 308. For example, each unit cell 306 can be about 100 nm by about 4 μm (e.g., 0.4 μm$^2$) and each sub-cell (not shown) can be about 20 nm by about 20 nm (e.g., 400 nm$^2$) such that each unit cell 306 contains, for example, a thousand (1000) sub-cells (not shown). In some embodiments, MEMS actuator 308 can include a piezoelectric material, a phase change material, or any other suitable material capable of variable actuation control. For example, as shown in FIG. 5, MEMS actuators 308 can include a piezoelectric material and be individually activated by an applied voltage to form inactive cells 307 and activated cells 309.

As shown in FIG. 3, variable alignment mark 310 can include variable alignment mark pitch 312, variable alignment mark sub-segmentation 330, and/or variable alignment mark depth 316. In some embodiments, variable alignment marks 310 can be for a calibration process, for example, SBO calibration. In some embodiments, variable alignment marks 310 can be configured to match another alignment mark, for example, wafer alignment mark 210. In some embodiments, variable diffraction grating 300 can include a plurality of variable alignment marks, for example, each similar to variable alignment mark 310. In some embodiments, as shown in FIG. 3, variable diffraction grating 300 can be operated at a specific variable alignment mark duty cycle 314. In some embodiments, variable alignment mark 310 can include a transmission sensor image (TIS) mark, an integrated lens interferometer at scanner (ILIAS) mark, a parallel integrated lens interferometer at scanner (PARIS) mark, and/or some combination thereof. For example, as shown in FIG. 3, variable diffraction grating 300 can include TIS mark 318, ILIAS mark 320, and PARIS mark 322. In some embodiments, wafer alignment mark 210 can include a TIS mark, an ILIAS mark, a PARIS mark, and/or some combination thereof.

As shown in FIGS. 2 and 3, calibration system 200 can include fixed alignment mark 310' disposed on plate 220. Fixed alignment mark 310' can be configured to act as a reference mark (e.g., fixed) for an initial calibration of calibration system 200 and/or lithographic apparatus LA (e.g., alignment sensor). For example, an arbitrary mark (e.g., 3.2 µm pitch, 50% duty cycle, no sub-segmentation, 120 nm depth) can be used for fixed alignment mark 310'. Alignment sensor can measure fixed alignment mark 310' for an initial calibration and/or measurement condition (e.g., one of eight channels, for example, Red X-polarization, can be chosen arbitrarily from four colors (e.g., Red, Green, Blue, UV) and two polarizations (e.g., X-polarization (horizontally polarized), Y-polarization (vertically polarized)). In some embodiments, if wafer alignment mark 210 matches fixed alignment mark 310' (e.g., same pitch, same duty cycle, same sub-segmentation, same depth) and the same initial calibration (e.g., Red X-polarization) is used for wafer alignment mark 210, no further calibration (e.g., SBO calibration) is necessary.

The embodiments of variable alignment mark 310 shown in FIGS. 3-13 and fixed alignment mark 310' shown in FIGS. 2 and 3 may be similar. Similar reference numbers are used to indicate similar features of the embodiments of variable alignment mark 310 shown in FIGS. 3-13 and the similar features of the embodiments of fixed alignment mark 310' shown in FIGS. 2 and 3. The main difference between the embodiments of variable alignment mark 310 shown in FIGS. 3-13 and the embodiments of fixed alignment mark 310' shown in FIGS. 2 and 3 is that fixed alignment mark 310' is fixed (e.g., invariable) and configured to act as a reference mark for an initial calibration (e.g., lithographic apparatus LA) of calibration system 200, rather than variable alignment mark 310 that is variable (e.g., not fixed) and configured to match wafer alignment mark 210.

As shown in FIG. 3, fixed alignment mark 310' can include fixed alignment mark position 311', fixed alignment mark pitch 312', fixed alignment mark 314' duty cycle, fixed alignment mark sub-segmentation 330', and/or fixed alignment mark depth 316'. In some embodiments, fixed alignment mark 310' can include MEMS actuator(s) 308'. In some embodiments, plate 220 can include one or more fixed alignment marks 310'. For example, as shown in FIGS. 2 and 3, plate 220 can include two fixed alignment marks 310' disposed at opposite ends of plate 220.

In some embodiments, variable diffraction grating 300 can be configured to match wafer alignment mark 210 in order to calibrate a shift-between-orders of one of variable alignment marks 310 and fixed alignment mark 310'. In some embodiments, a shift-between-orders (SBO) is a difference between variable alignment mark position 311 and fixed alignment mark position 311'. In some embodiments, fixed alignment mark 310' can include a microelectromechanical system (MEMS) actuator. For example, fixed alignment mark 310' can include a piezoelectric material or a phase change material (PCM). In some embodiments, fixed alignment mark 310' can include a liquid crystal (LC) spatial light modulator (SLM).

In some embodiments, fixed alignment mark 310' can include fixed alignment mark pitch 312', fixed alignment mark duty cycle 314', fixed alignment mark sub-segmentation 330', and/or fixed alignment mark depth 316'. In some embodiments, variable alignment mark pitch 312 can be configured to be different than fixed alignment mark pitch 312' while variable alignment mark duty cycle 314, variable alignment mark sub-segmentation 330, and variable alignment mark depth 316 are configured to be the same as fixed alignment mark duty cycle 314', fixed alignment mark sub-segmentation 330', and fixed alignment mark depth 316'. In some embodiments, fixed alignment mark pitch 312' and/or variable alignment mark pitch 312 can be about 0.2 µm to about 6.4 µm.

In some embodiments, variable alignment mark duty cycle 314 can be configured to be different than fixed alignment mark duty cycle 314' while variable alignment mark pitch 312, variable alignment mark sub-segmentation 330, and variable alignment mark depth 316 are configured to be the same as fixed alignment mark pitch 312', fixed alignment mark sub-segmentation 330', and fixed alignment mark depth 316'. In some embodiments, fixed alignment mark duty cycle 314' and/or variable alignment mark duty cycle 314 can be a fraction of the plurality of unit cells 306.

In some embodiments, variable alignment mark sub-segmentation 330 can be configured to be different than fixed alignment mark sub-segmentation 330' while variable alignment mark pitch 312, variable alignment mark duty cycle 314, and variable alignment mark depth 316 are configured to be the same as fixed alignment mark pitch 312', fixed alignment mark duty cycle 314', and fixed alignment mark depth 316'. In some embodiments, fixed alignment mark sub-segmentation 330' and/or variable alignment mark sub-segmentation 330 can include a horizontal line 332, a vertical line 334, a diagonal line 336, a polygon 338, or some combination thereof. In some embodiments, fixed alignment mark sub-segmentation 330' and/or variable alignment mark sub-segmentation 330 can include a variable sub-pitch, for example, first variable sub-pitch 333 (e.g., vertical), second variable sub-pitch 335 (e.g., horizontal), and/or third variable sub-pitch 337 (e.g., diagonal).

In some embodiments, variable alignment mark depth 316 can be configured to be different than fixed alignment mark depth 316' while variable alignment mark pitch 312, variable alignment mark duty cycle 314, and variable alignment mark sub-segmentation 330 are configured to be the same as fixed alignment mark pitch 312', fixed alignment mark duty cycle 314', and fixed alignment mark sub-segmentation 330'. In some embodiments, fixed alignment mark depth 316' and/or variable alignment mark depth 316 can be about 10 nm to about 220 nm. For example, fixed alignment mark depth 316' and/or variable alignment mark depth 316 can be about $\lambda/4$, for example, for a wavelength ($\lambda$) of about 880 nm.

Figure 6:
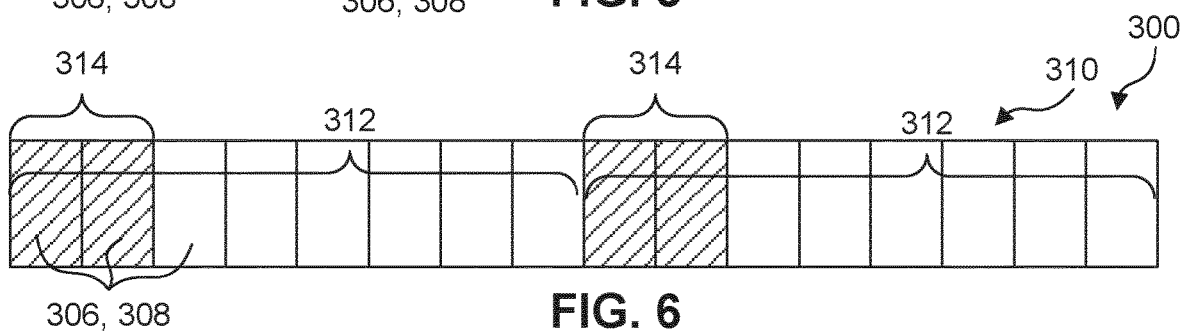
FIG. 6 is a top plan schematic of a variable diffraction grating, according to an exemplary embodiment.
Figure 7:
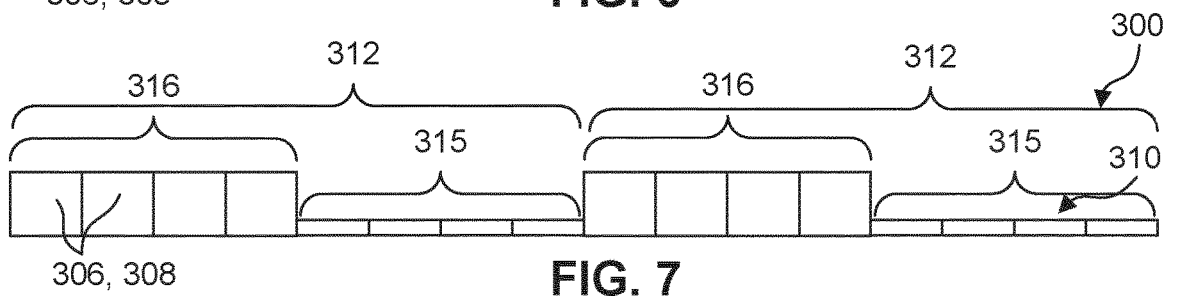
FIG. 7 is a side schematic of a variable diffraction grating, according to an exemplary embodiment.
Figure 8:
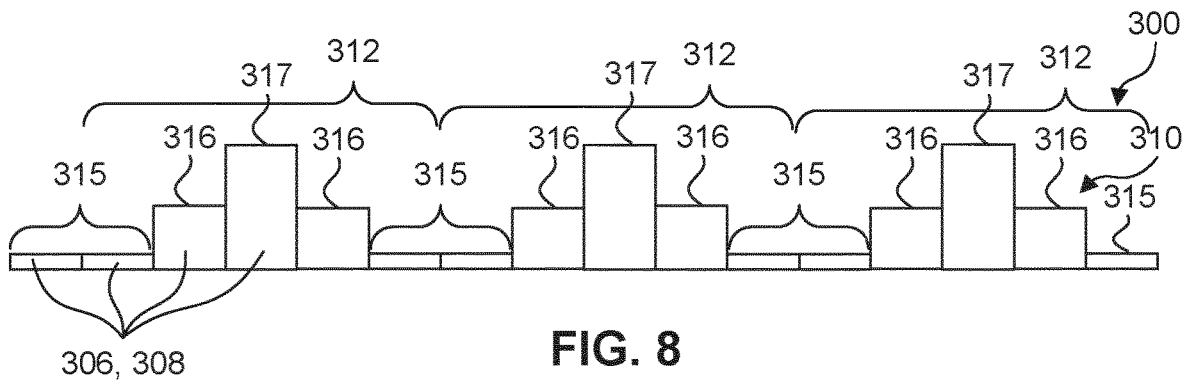
FIG. 8 is a side schematic of a variable diffraction grating, according to an exemplary embodiment.

FIGS. 3-13 illustrate variable diffraction grating 300, according to various embodiments. FIGS. 4-6 and 9-13 illustrate a top plan schematic of variable diffraction grating 300, and FIGS. 7 and 8 illustrate a side schematic of variable diffraction grating 300. FIG. 7 illustrates a side schematic of FIG. 5.

As discussed above, variable diffraction grating 300 can change a variety of parameters of the plurality of unit cells 306. For example, variable diffraction grating 300 can change variable alignment mark pitch 312, variable alignment mark duty cycle 314, variable alignment mark depth 316, variable alignment mark sub-segmentation 330, and/or some combination thereof.

Figure 4:
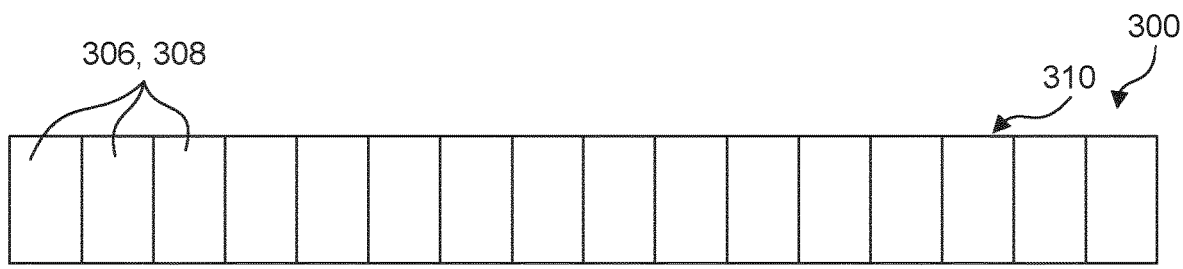
FIG. 4 is a top plan schematic of a variable diffraction grating, according to an exemplary embodiment.

As shown in FIG. 4, variable diffraction grating 300 can include the plurality of unit cells 306, each of which can be a MEMS actuator 308, forming variable alignment mark 310. In some embodiments, the plurality of unit cells 306 can form a plurality of variable alignment marks 310.

Figure 9:
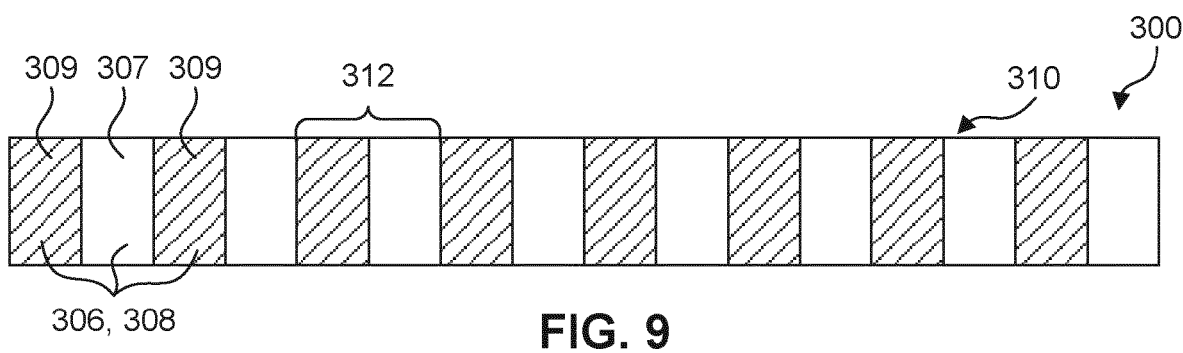
FIG. 9 is a top plan schematic of a variable diffraction grating, according to an exemplary embodiment.

As shown in FIG. 5, variable diffraction grating 300 can selectively activate the plurality of unit cells 306 to form inactive cells 307 and activated cells 309 with variable alignment mark pitch 312. In some embodiments, variable diffraction grating 300 can selectively activate the plurality of unit cells 306 by applying a voltage to the plurality of unit cells 306. For example, as shown in FIG. 9, a voltage can be applied to the plurality of unit cells 306 to form an alternating pattern of activated cells 309 and inactive cells 307 (e.g., diffraction grating). In some embodiments, variable diffraction grating 300 can selectively activate the plurality of unit cells 306 to operate at a specific variable alignment mark duty cycle 314 (e.g., 25%, 50%, etc.). For example, as shown in FIG. 5, a voltage can be applied to the plurality of unit cells 306 with variable alignment mark pitch 312 to form an alternating pattern of activated cells 309 and inactive cells 307 (e.g., diffraction grating) corresponding to a 50% variable alignment mark duty cycle 314 (e.g., activated cells 309 correspond to half of the space-wise period). For example, as shown in FIG. 6, a voltage can be applied to the plurality of unit cells 306 with variable alignment mark pitch 312 to form a different pattern of activated cells 309 and inactive cells 307 (e.g., asymmetric diffraction grating) corresponding to a 25% variable alignment mark duty cycle 314 (e.g., activated cells 309 correspond to a quarter of the space-wise period). In some embodiments, variable alignment mark duty cycle 314 (e.g., 25%, 50%, etc.) can be a spatial period.

In some embodiments, as shown in FIGS. 5 and 9, variable alignment mark 310 can be formed with a repeated periodicity (e.g., variable alignment mark pitch 312) from inactive cells 307 and activated cells 309. For example, variable alignment mark 310 can be a diffraction grating. In some embodiments, wafer alignment mark 210 can include wafer alignment mark pitch 212 and variable alignment mark 310 can include variable alignment mark pitch 312 configured to match wafer alignment mark pitch 212. For example, variable alignment mark pitch 312 can match wafer alignment mark pitch 212 for a calibration process (e.g., SBO calibration, interpolation). In some embodiments, a comparison between variable alignment mark 310 (e.g., configured to match wafer alignment mark 210) and fixed alignment mark 310' can be configured to reduce SBO calibration errors and/or interpolation calibration errors. In some embodiments, variable alignment mark pitch 312 can be about 0.2 μm to about 6.4 μm. For example, variable alignment mark pitch 312 can be about 0.8 μm, 1 μm, 1.2 μm, 1.4 μm, 1.6 μm, 1.8 μm, 2 μm, 2.2 μm, 2.4 μm, 2.6 μm, 2.8 μm, 3 μm, or 3.2 μm.

As shown in FIGS. 5 and 6, variable diffraction grating 300 can include variable alignment mark duty cycle 314 of variable alignment mark pitch 312. Variable alignment mark duty cycle 314 can be configured to measure different diffraction orders, for example, of wafer alignment mark 210 and/or fixed alignment mark 310'. For example, FIG. 5 shows a variable alignment mark duty cycle 314 of 50% for variable alignment mark pitch 312 while FIG. 6 shows a variable alignment mark duty cycle 314 of 25% for variable alignment mark pitch 312. By maintaining the same pitch (e.g., variable alignment mark pitch 312), which can be adjusted to match wafer alignment mark pitch 212 (e.g., a pitch of interest), different diffraction orders can be scanned by adjusting the variable alignment mark duty cycle 314 (e.g., 25%, 50%, 75%, etc.). In some embodiments, variable alignment mark duty cycle 314 can be a fraction of the plurality of unit cells 306. For example, as shown in FIG. 6, variable alignment mark duty cycle 314 is 25% (e.g., 4 out of 16 unit cells 306).

As shown in FIGS. 7 and 8, variable alignment mark 310 can be formed with different depths and can include variable alignment mark base depth 315, variable alignment mark depth 316, and/or variable alignment mark second depth 317. For example, as shown in FIG. 7, which is a side schematic of variable diffraction grating 300 shown in FIG. 5, variable alignment mark 310 can have inactive cells 307 at variable alignment mark base depth 315 and activated cells 309 at variable alignment mark depth 316. In some embodiments, wafer alignment mark 210 can include wafer alignment mark depth 216 and variable alignment mark 310 can include variable alignment mark depth 316 configured to match wafer alignment mark depth 216. For example, variable alignment mark depth 316 can match wafer alignment mark depth 216 for a calibration process (e.g., SBO calibration, interpolation). In some embodiments, variable alignment mark depth 316 can be configured to optimize and/or tune an intensity from variable alignment mark 310 to that of fixed alignment mark 310' to reduce SBO calibration errors and/or interpolation calibration errors and improve detection (e.g., normalize intensities). In some embodiments, variable diffraction grating 300 can include a plurality of depths for the plurality of unit cells 306, for example, variable alignment mark base depth 315, variable alignment mark depth 316, and/or variable alignment mark second depth 317. For example, as shown in FIG. 8, variable alignment mark 310 can include variable alignment mark base depth 315, variable alignment mark depth 316, and variable alignment mark second depth 317 as repeatable patterns to create, for example, a triple-diffraction grating (e.g., with λ/6 depth intervals over variable alignment mark pitch 312). In some embodiments, variable alignment mark depth 316 and/or variable alignment mark second depth 317 can be about 10 nm to about 220 nm. For example, variable alignment mark depth 316 can be about 50 nm and variable alignment mark second depth 317 can be about 100 nm.

Figure 10:
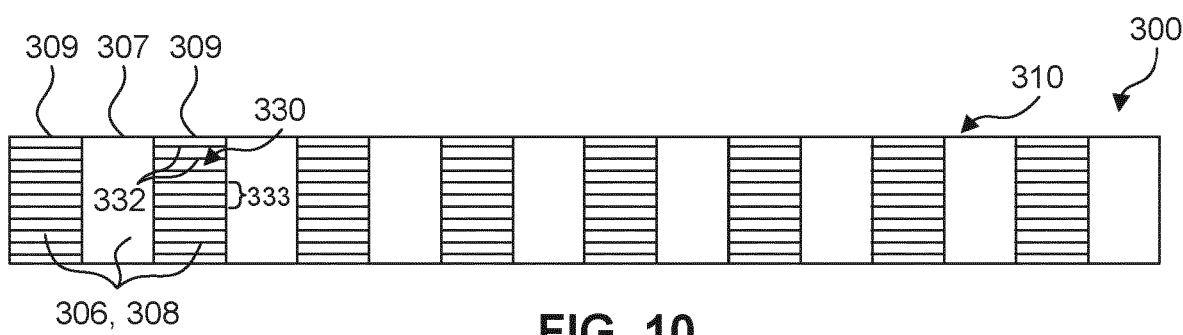
FIG. 10 is a top plan schematic of a variable diffraction grating, according to an exemplary embodiment.
Figure 11:
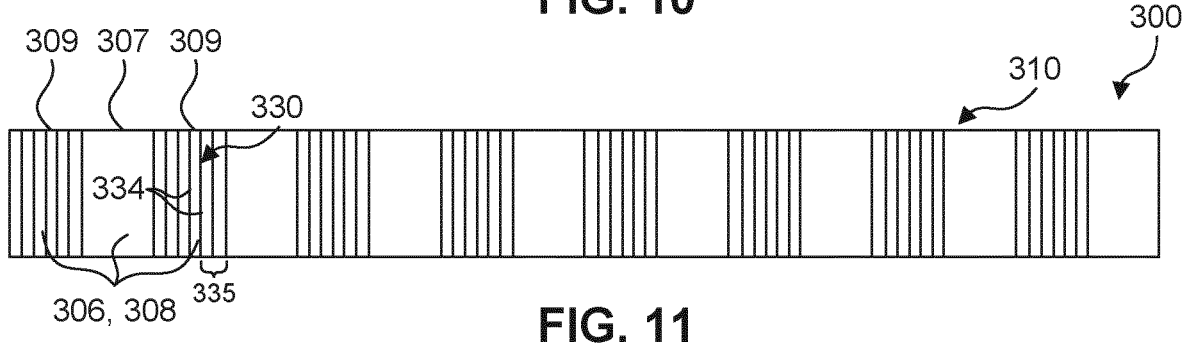
FIG. 11 is a top plan schematic of a variable diffraction grating, according to an exemplary embodiment.
Figure 12:
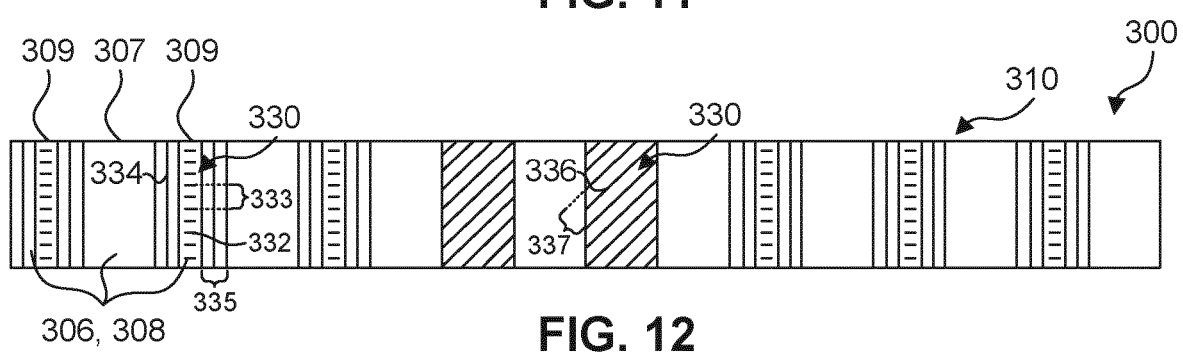
FIG. 12 is a top plan schematic of a variable diffraction grating, according to an exemplary embodiment.
Figure 13:
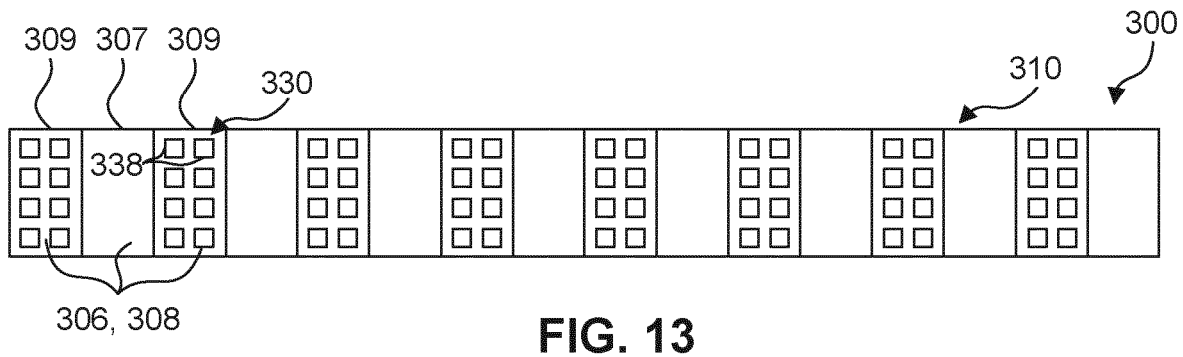
FIG. 13 is a top plan schematic of a variable diffraction grating, according to an exemplary embodiment.

As described above and shown in FIG. 9, variable alignment mark 310 can be formed with a repeated periodicity (e.g., variable alignment mark pitch 312) from inactive cells 307 and activated cells 309. FIGS. 10-13 illustrate alternative variable alignment mark sub-segmentation 330 of activated cells 309, for example, horizontal lines 332, first variable sub-pitch 333 (vertical pitch), vertical lines 334, second variable sub-pitch 335 (horizontal pitch), diagonal lines 336, third variable sub-pitch 337, polygons 338, and/or some combination thereof. Variable alignment mark sub-segmentation 330 can be activation of sub-cells (not shown) within each activated cell 309 for further pattern definition and/or complexity, for example, forming horizontal lines 332 with first variable sub-pitch 333. Each sub-cell (not shown) can be on the order of 20 nm by 20 nm (e.g., 400 nm$^2$). For example, as shown in FIG. 10, activated cells 309 can include variable alignment mark sub-segmentation 330 that includes horizontal lines 332 and first variable sub-pitch 333. For example, as shown in FIG. 11, activated cells 309 can include variable alignment mark sub-segmentation 330 that includes vertical lines 334 and second variable sub-pitch 335. For example, as shown in FIG. 12, activated cells 309 can include variable alignment mark sub-segmentation 330 that includes a combination of horizontal lines 332 and vertical lines 334 and first and second variable sub-pitches 333, 335, respectively. For example, as shown in FIG. 12, activated cells 309 can include variable alignment mark sub-segmentation 330 that includes diagonal lines 336 and third variable sub-pitch 337. For example, as shown in FIG. 13, activated cells 309 can include variable alignment mark sub-segmentation 330 that includes polygons 338, for example, squares within each activated cell 309.

In some embodiments, wafer alignment mark 210 can include wafer alignment mark sub-segmentation 214 and one of the variable alignment marks 310 can include variable alignment mark sub-segmentation 330 configured to match wafer alignment mark sub-segmentation 214. For example, variable alignment mark sub-segmentation 330 can match wafer alignment mark sub-segmentation 214 for a calibration process (e.g., SBO calibration). In some embodiments, variable alignment mark sub-segmentation 330 can be configured to reduce SBO calibration errors and/or optimize diffraction orders of variable alignment mark 310. In some embodiments, variable alignment mark sub-segmentation 330 can include a horizontal line 332, a vertical line 334, a diagonal line 336, a polygon 336, and/or some combination thereof. For example, as shown in FIG. 12, variable alignment mark sub-segmentation 330 can include a combination of horizontal lines 332 and vertical lines 334.

In some embodiments, lithographic apparatus LA can include calibration system 200 configured to calibrate a shift-between-orders 302 of fixed alignment mark 310' on plate 220 and one of the plurality of variable alignment marks 310 on variable diffraction grating 300. In some embodiments, wafer alignment mark 210 can include wafer alignment mark pitch 212 and wafer alignment mark depth 216 and one of the plurality of variable alignment marks 310 can include variable alignment mark pitch 312 configured to match wafer alignment mark pitch 212 and variable alignment mark depth 316 configured to match wafer alignment mark depth 216. In some embodiments, variable diffraction grating 300 can include variable alignment mark duty cycle 314 configured to measure different diffraction orders of fixed alignment mark 310'. In some embodiments, wafer alignment mark 210 can include wafer alignment mark sub-segmentation 214 and one of the plurality of variable alignment marks 310 can include variable alignment mark sub-segmentation 330 configured to match wafer alignment mark sub-segmentation 214.

Exemplary Flow Diagram

Figure 14:
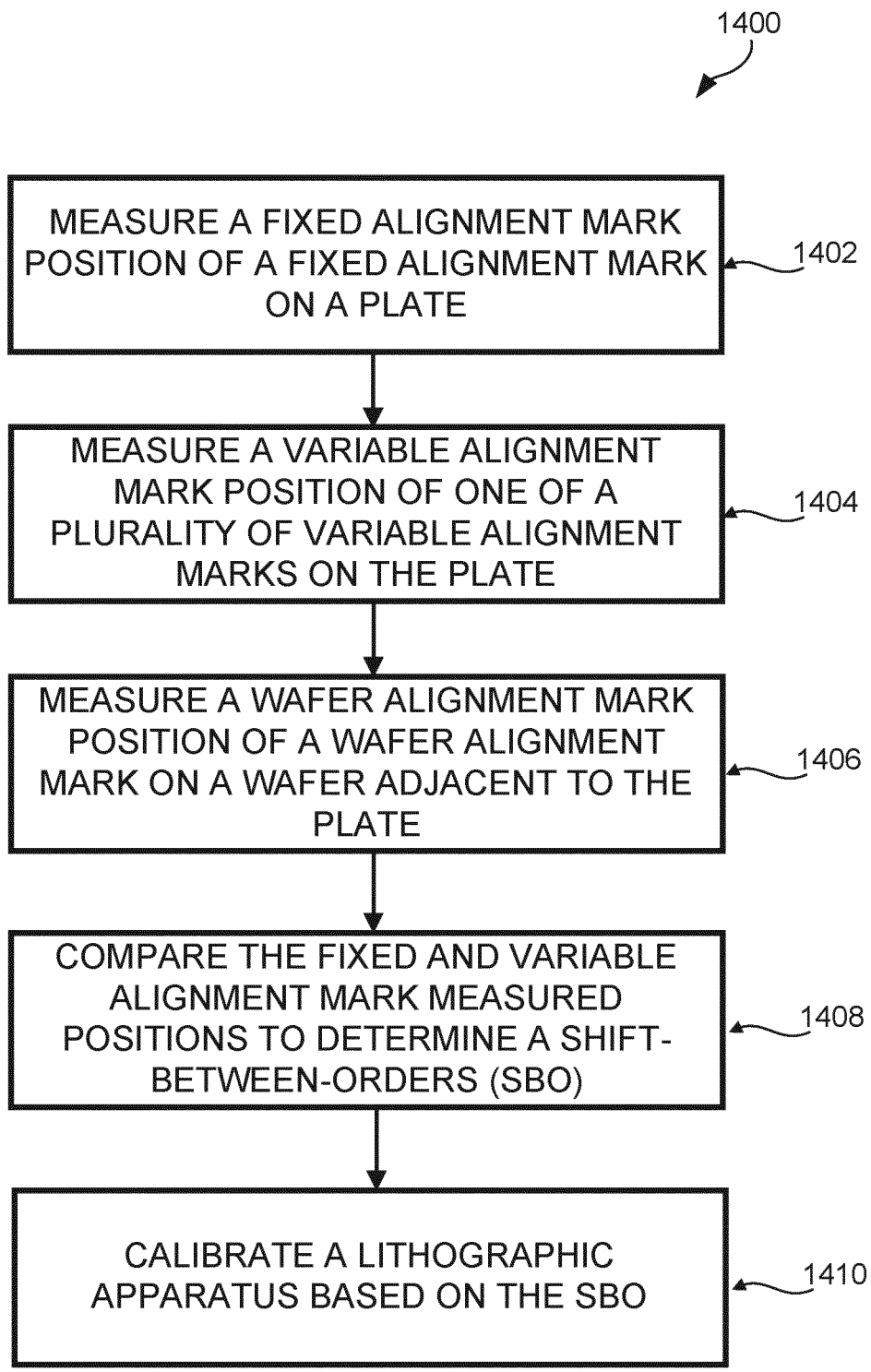
FIG. 14 illustrates a flow diagram for calibrating a lithographic apparatus, according to an exemplary embodiment.

FIG. 14 illustrates flow diagram 1400 for calibrating lithographic apparatus LA (e.g., alignment position, SBO, etc.), according to an embodiment. It is to be appreciated that not all steps in FIG. 14 are needed to perform the disclosure provided herein. Further, some of the steps may be performed simultaneously, or in a different order than shown in FIG. 14. Flow diagram 1400 shall be described with reference to FIG. 3. However, flow diagram 1400 is not limited to those example embodiments.

In step 1402, as shown in the example of FIG. 3, a fixed alignment mark position 311' of fixed alignment mark 310' on plate 220 is measured. For example, fixed alignment mark position 311' can include X-Y-Z coordinates and/or diffraction order position and can be measured by a processor (not shown) and/or alignment sensor (not shown) of lithographic apparatus LA and/or calibration system 200. In some embodiments, the measurement of fixed alignment mark position 311' can occur in real-time, for example, within 0.2 seconds.

In step 1404, as shown in the example of FIG. 3, a variable alignment mark position 311 of one of the plurality of variable alignment marks 310 of variable diffraction grating 300 on plate 220 adjacent to wafer 202 is measured. The plurality of variable alignment marks 310 includes a plurality of variable actuators, for example, MEMS actuators 308. For example, variable alignment mark position 311 can include X-Y-Z coordinates and/or diffraction order position and can be measured by a processor (not shown) and/or alignment sensor (not shown) of lithographic apparatus LA and/or calibration system 200. In some embodiments, the measurement of variable alignment mark position 311 can occur simultaneously with step 1402 or in real-time, for example, within 0.2 seconds.

In step 1406, as shown in the example of FIG. 3, a wafer alignment mark position 211 of wafer alignment mark 210 on wafer 202 is measured. For example, wafer alignment mark position 211 can include X-Y-Z coordinates and/or diffraction order position and can be measured by a processor (not shown) and/or alignment sensor (not shown) of lithographic apparatus LA and/or calibration system 200. In some embodiments, the measurement of wafer alignment mark position 211 can occur in real-time, for example, within 0.2 seconds.

In step 1408, as shown in the example of FIG. 3, fixed alignment mark position 311' (e.g., X-Y-Z coordinates, diffraction order position) and variable alignment mark position 311 (e.g., X-Y-Z coordinates, diffraction order position) can be compared by a processor (not shown) and/or alignment sensor (not shown), for example, a differential sensor, of lithographic apparatus LA and/or calibration system 200 to determine a shift-between-orders (SBO) 302 of one of the plurality of variable alignment marks 310 and fixed alignment mark 310'. For example, a difference in measured position 304 (e.g., X-Y-Z coordinates, diffraction order position) can be compared.

In step 1410, as shown in the example of FIG. 3, lithographic apparatus LA is calibrated based on SBO 302. For example, an error in measured position between variable alignment mark 310 and fixed alignment mark 310' can be corrected, for example, by a processor (not shown) and/or alignment sensor (not shown) of lithographic apparatus LA and/or calibration system 200.

In some embodiments, flow diagram 1400 can further include activating the plurality of actuators (e.g., MEMS actuators 308) to form the plurality of variable alignment marks 310 based on a characteristic of wafer alignment mark 210. For example, the characteristic of wafer alignment mark 210 can include a pitch, a diffraction order, an alignment position, a sub-segmentation, a depth, and/or some combination thereof. In some embodiments, the activating can include adjusting a pitch, a duty cycle, a sub-segmentation, a depth, or some combination thereof of the plurality of variable actuators (e.g., MEMS actuators 308). In some embodiments, the calibrating can include applying a shift-between-orders (SBO) correction to wafer alignment mark position 211.

In some embodiments, an alignment sensor (not shown) can measure fixed alignment mark 310' for an initial calibration and/or measurement condition (e.g., one of eight channels, for example, Red X-polarization, can be chosen arbitrarily from four colors (e.g., Red, Green, Blue, UV) and two polarizations (e.g., X-polarization (horizontally polarized), Y-polarization (vertically polarized)). In some embodiments, if wafer alignment mark 210 does not match fixed alignment mark 310' (e.g., same pitch, same duty cycle, same sub-segmentation, same depth) and/or the same initial calibration (e.g., Red X-polarization) is not used for wafer alignment mark 210, a calibration/correction (e.g., SBO correction) is necessary for accurate wafer alignment mark position 211. For example, variable alignment mark 310 can be configured to match wafer alignment mark 210 (e.g., same pitch, same duty cycle, same sub-segmentation, same depth), which is different from fixed alignment mark 310' (e.g., different pitch, different duty cycle, different sub-segmentation, different depth), to provide an additional mark (e.g., in addition to fixed alignment mark 310') for SBO calibration, for example, by comparing variable alignment mark position 311 to fixed alignment mark position 311'. In some embodiments, the obtained difference/comparison between variable alignment mark position 311 to fixed alignment mark position 311' (e.g., SBO correction) can be applied to wafer alignment mark position 211.

Exemplary Variable Diffraction Grating

Figure 15:
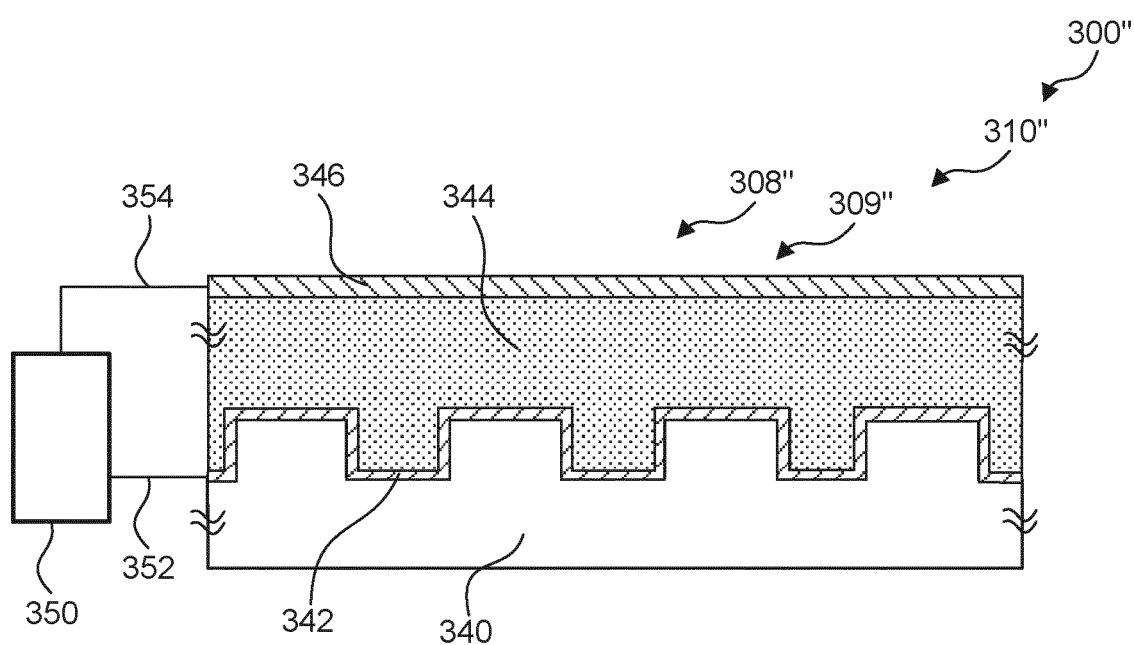
FIG. 15 is a side schematic of a variable diffraction grating, according to an exemplary embodiment.

FIG. 15 illustrates an alternative variable diffraction grating 300", according to various embodiments. In some embodiments, variable diffraction grating 300" can be configured to provide a plurality of variable alignment marks 310".

FIG. 15 illustrates variable diffraction grating 300", according to an exemplary embodiment. The embodiments of variable diffraction grating 300 shown in FIGS. 3-13 and the embodiments of variable diffraction grating 300" shown in FIG. 15 may be similar. Similar reference numbers are used to indicate similar features of the embodiments of variable diffraction grating 300 shown in FIGS. 3-13 and the similar features of the embodiments of variable diffraction grating 300" shown in FIG. 15. The main difference between the embodiments of variable diffraction grating 300 shown in FIGS. 3-13 and the embodiments of variable diffraction grating 300" shown in FIG. 15 is that variable diffraction grating 300" includes a liquid crystal (LC) spatial light modulator (SLM) 308", rather than variable diffraction grating 300 with MEMS actuator 308 shown in FIGS. 3-13. In some embodiments, as shown in FIG. 15, variable diffraction grating 300" can include variable alignment mark 310", activated cell 309", and liquid crystal (LC) spatial light modulator (SLM) 308".

As shown in FIG. 15, an exemplary aspect of variable diffraction grating 300" is liquid crystal (LC) spatial light modulator (SLM) 308". Liquid crystal (LC) spatial light modulator (SLM) 308" can be configured to change a phase delay in variable diffraction grating 300" that can change a reflecting light shape and/or intensity. In some embodiments, liquid crystal (LC) spatial light modulator (SLM) 308" can be configured to change a reflected light shape and/or intensity without physically changing a base grating 340. For example, different voltages can be applied to first and second conductive layers 342, 344 to produce different reflected light shape and/or intensity.

Variable diffraction grating 300" can include liquid crystal (LC) spatial light modulator (SLM) 308" and voltage source 350. Liquid crystal (LC) spatial light modulator (SLM) 308" can include base grating 340, first conductive layer 342, liquid crystal (LC) layer 344, and second conductive layer 344. Liquid crystal (LC) layer 344 can be disposed between first and second conductive layers 342, 344. In some embodiments, first conductive layer 342 can coat base grating 340, for example, a reflective metal (e.g., gold, aluminum, silver, etc.). In some embodiments, second conductive layer 344 can be a transparent conducting firm, for example, indium tin oxide (ITO), fluorine doped tin oxide (FTO), and/or doped zinc oxide. In some embodiments, liquid crystal (LC) layer 344 can be nematic.

Voltage source 350 can include first connection 352 and second connection 354. Voltage source 350 can be configured to apply a voltage difference across liquid crystal (LC) layer 344. First connection 352 can be connected to first conductive layer 342 and be configured to supply a first potential (e.g., negative or ground). Second connection 354 can be connected to second conductive layer 344 and be configured to supply a second potential (e.g., positive). In some embodiments, applying a voltage difference across liquid crystal (LC) layer 344 can change a phase delay in liquid crystal (LC) spatial light modulator (SLM) 308". For example, a reflected light shape and/or intensity can be changed by applying different voltages.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate (e.g., wafer) referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments in the context of optical lithography, it will be appreciated that the embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "wafer" as used herein describes a material onto which material layers are added. In some embodiments, the wafer itself may be patterned and materials added on top of it may also be patterned, or may remain without patterning.

Embodiments may be implemented in hardware, firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments have been described above, it will be appreciated that the embodiments may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The embodiments have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the embodiments. Therefore, such adaptations and modifications are intended to be within the meaning and range of equivalents of the disclosed embodiments, based on the teaching and guidance presented herein.

The breadth and scope of the embodiments should not be limited by any of the above-described exemplary embodiments, but should be defined only in accordance with the following claims and their equivalents.

The invention claimed is:

1. A calibration system comprising:
a plate adjacent to a wafer alignment mark disposed on a wafer;
a fixed alignment mark disposed on the plate and configured to act as a reference mark for an initial calibration of the calibration system; and
a variable diffraction grating disposed on the plate and comprising a plurality of unit cells configured to form a plurality of variable alignment marks,
wherein the variable diffraction grating is configured to match the wafer alignment mark in order to calibrate a shift-between-orders of one of the variable alignment marks and the fixed alignment mark.

2. The calibration system of claim 1, wherein the shift-between-orders is a difference in measured position between one of the variable alignment marks and the fixed alignment mark.

3. The calibration system of claim 1, wherein each of the plurality of unit cells comprises a microelectromechanical system (MEMS) actuator.

4. The calibration system of claim 1, wherein each of the plurality of unit cells comprises a liquid crystal (LC) spatial light modulator (SLM).

5. The calibration system of claim 1, wherein the fixed alignment mark comprises a fixed alignment mark pitch, a fixed alignment mark duty cycle, a fixed alignment mark sub-segmentation, and a fixed alignment mark depth.

6. The calibration system of claim 5, wherein the variable alignment mark comprises a variable alignment mark pitch configured to be different than the fixed alignment mark pitch.

7. The calibration system of claim 6, wherein the variable alignment mark comprises a variable alignment mark duty cycle, a variable alignment mark sub-segmentation, and a variable alignment mark depth configured to be the same as the fixed alignment mark duty cycle, the fixed alignment mark sub-segmentation, and the fixed alignment mark depth.

8. The calibration system of claim 5, wherein the variable alignment mark comprises a variable alignment mark duty cycle configured to be different than the fixed alignment mark duty cycle.

9. The calibration system of claim 5, wherein the variable alignment mark comprises a variable alignment mark pitch, a variable alignment mark sub-segmentation, and a variable alignment mark depth configured to be the same as the fixed alignment mark pitch, the fixed alignment mark sub-segmentation, and the fixed alignment mark depth.

10. The calibration system of claim 5, wherein the variable alignment mark comprises a variable alignment mark sub-segmentation configured to be different than the fixed alignment mark sub-segmentation.

11. The calibration system of claim 5, wherein the variable alignment mark comprises a variable alignment mark pitch, a variable alignment mark duty cycle, and a variable alignment mark depth configured to be the same as the fixed alignment mark pitch, the fixed alignment mark duty cycle, and the fixed alignment mark depth.

12. The calibration system of claim 5, wherein the variable alignment mark comprises a variable alignment mark depth configured to be different than the fixed alignment mark depth.

13. A lithographic apparatus comprising:
an illumination system configured to illuminate a patterning device;
a projection system configured to project an image of the patterning device onto a wafer; and
a calibration system comprising:
a plate adjacent to a wafer alignment mark disposed on a wafer;

a fixed alignment mark disposed on the plate and configured to act as a reference mark for an initial calibration of the calibration system; and a variable diffraction grating disposed on the plate and comprising a plurality of unit cells configured to form a plurality of variable alignment marks, wherein the variable diffraction grating is configured to match the wafer alignment mark in order to calibrate a shift-between-orders of one of the variable alignment marks and the fixed alignment mark.

14. A method comprising:

measuring a fixed alignment mark position of a fixed alignment mark on a plate;

measuring a variable alignment mark position of one of a plurality of variable alignment marks on the plate, wherein the plurality of variable alignment marks comprises a plurality of variable actuators;

measuring a wafer alignment mark position of a wafer alignment mark on a wafer adjacent to the plate;

comparing the fixed alignment mark position and the variable alignment mark position of the plate to determine a shift-between-orders of one of the variable alignment marks and the fixed alignment mark; and calibrating the lithographic apparatus based on the shift-between-orders.

15. The method of claim 14, further comprising activating the plurality of variable actuators to form the plurality of variable alignment marks based on a characteristic of the wafer alignment mark.

16. The method of claim 14, wherein the activating comprises adjusting a pitch, a duty cycle, a sub-segmentation, a depth, or some combination thereof of the plurality of variable actuators.

17. The method of claim 14, wherein the calibrating comprises applying a shift-between-orders correction to the wafer alignment mark position.

* * * * *